US010580569B2

(12) United States Patent
Ogawa et al.

(10) Patent No.: US 10,580,569 B2
(45) Date of Patent: Mar. 3, 2020

(54) ELECTRONIC COMPONENT INCLUDING PLANAR TRANSFORMER

(71) Applicant: TAMURA CORPORATION, Nerima-ku, Tokyo (JP)

(72) Inventors: Hiroo Ogawa, Saitama (JP); Tomohiko Yoshino, Saitama (JP)

(73) Assignee: TAMURA CORPORATION, Tokyo (JP)

( * ) Notice: Subject to any disclaimer, the term of this patent is extended or adjusted under 35 U.S.C. 154(b) by 0 days.

(21) Appl. No.: 16/413,936

(22) Filed: May 16, 2019

(65) Prior Publication Data

US 2019/0371516 A1    Dec. 5, 2019

(30) Foreign Application Priority Data

Jun. 1, 2018 (JP) ................. 2018-106187

(51) Int. Cl.
| | |
|---|---|
| *H05K 3/10* | (2006.01) |
| *H01F 27/30* | (2006.01) |
| *H01F 27/28* | (2006.01) |
| *H05K 1/16* | (2006.01) |
| *H01F 27/26* | (2006.01) |
| *H01F 27/29* | (2006.01) |

(52) U.S. Cl.
CPC ....... *H01F 27/306* (2013.01); *H01F 27/2804* (2013.01); *H05K 1/165* (2013.01); *H01F 27/263* (2013.01); *H01F 27/29* (2013.01); *H01F 2027/2809* (2013.01); *H01F 2027/2819* (2013.01)

(58) Field of Classification Search
CPC .. H01F 27/306; H01F 27/2804; H01F 27/263; H01F 27/29; H05K 1/165

USPC .......................................... 174/251
See application file for complete search history.

(56) References Cited

U.S. PATENT DOCUMENTS

| | | | |
|---|---|---|---|
| 5,353,001 A | 10/1994 | Meinel et al. | |
| 2004/0032313 A1 | 2/2004 | Ferencz et al. | |

(Continued)

FOREIGN PATENT DOCUMENTS

| | | |
|---|---|---|
| GB | 2252208 B | 5/1995 |
| JP | 3818478 B2 | 9/2006 |

OTHER PUBLICATIONS

Extended European Search Report (EESR) dated Oct. 29, 2019 issued in European Application No. 19175366.4.

*Primary Examiner* — Tremesha S Willis
(74) *Attorney, Agent, or Firm* — Holtz, Holtz & Volek PC (57) ABSTRACT

An electronic component 100 includes: a circuit board module 104 which is composed of a plurality of layers, and in which a primary circuit 120 and secondary circuits 122, 124 are each formed using wring patterns of a first layer L1 to an eighth layer L8; and a magnetic core 106 which magnetically couples the primary circuit 120 and the secondary circuits 122, 124. The circuit board module 104 includes: cutout portions 104*b* which are formed in a cutout shape from side edge portions toward an inner side and which position the magnetic core 106 at a predetermined attachment position in a state of housing the magnetic core 106; and widened portions 104*c* which continue from the cutout portions 104*b* and are formed in a cutout shape from the side edge portions toward the inner side of the circuit board module 104, and which are formed on sides of the magnetic core 106 so as to be larger than a width W1 for housing of the cutout portions 104*b*.

2 Claims, 9 Drawing Sheets

(56) References Cited

U.S. PATENT DOCUMENTS

2004/0239466 A1 12/2004 Rouser
2011/0102121 A1 5/2011 Otsuka et al.

ELECTRONIC COMPONENT INCLUDING PLANAR TRANSFORMER

BACKGROUND OF THE INVENTION

Field of the Invention

The present invention relates to an electronic component, specifically relates to an electronic component having a planar transformer.

Description of the Related Art

A sheet-type transformer has a structure in which a sheet-type coil stack is mounted on a multilayer printed wiring board and they are sandwiched by a ferrite core. In this transformer, the ferrite core is divided into two upper and lower parts and is assembled with both the parts facing each other in the thickness direction of the multilayer printed wiring board and the sheet-type coil stack. In the assembled transformer, the ferrite core is entirely inserted in an insertion hole formed on the multilayer printed circuit board, whereby a magnetic circuit is formed.

SUMMARY OF THE INVENTION

The present invention disclosed and claimed herein, in one aspect thereof, comprises an electronic component. The component includes: a circuit board in which a primary circuit and a secondary circuit are each formed using a plurality of layers of wiring patterns; a magnetic core attached to the circuit board to magnetically couple the primary circuit and the secondary circuit; a cutout portion which is formed in a cutout shape from a side edge portion toward an inner side of the circuit board and which fixes the magnetic core at a predetermined attachment position in a state of housing the magnetic core; and a widened portion which continues from the cutout portion and is formed in a cutout shape from the side edge portion toward the inner side of the circuit board, and which is formed on a side of the magnetic core so as to be larger than a width that the cutout portion has for housing the magnetic core.

Further scope of applicability of the present invention will become apparent from the detailed description given hereinafter. The detailed description and embodiments are only given as examples though showing preferred embodiments of the present invention, and therefore, from the contents of the following detailed description, changes and modifications of various kinds within the spirits and scope of the invention will become apparent to those skilled in the art.

BRIEF DESCRIPTION OF THE DRAWINGS

The present invention will be fully understood from the following detailed description and the accompanying drawings. The accompanying drawings only show examples and are not intended to restrict the present invention. In the accompanying drawings.

DETAILED DESCRIPTION

Figure 1:
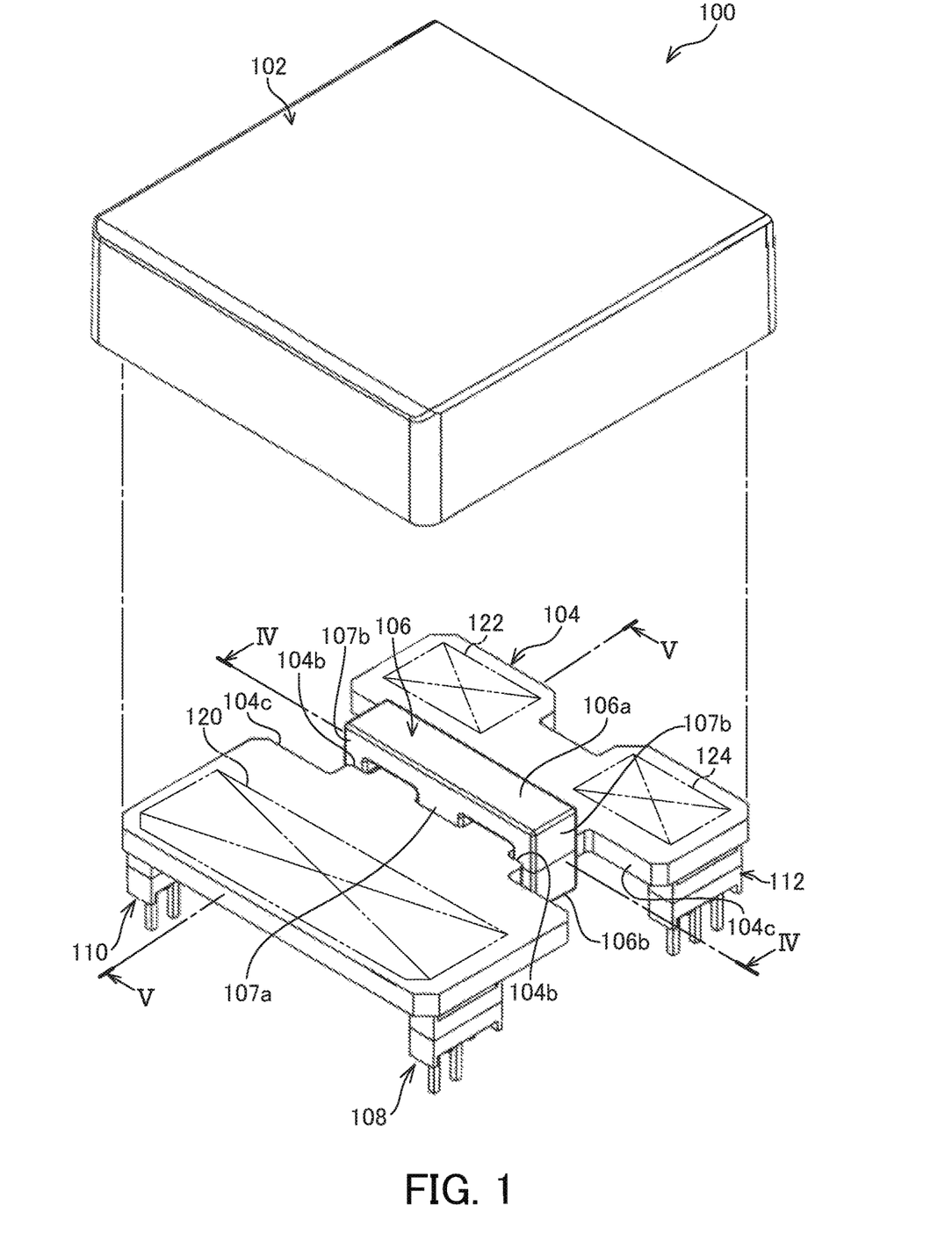
FIG. 1 is an exploded perspective view schematically illustrating the structure of an electronic component of one embodiment.

FIG. 1 schematically illustrates the structure of an electronic component 100 of one embodiment. In this embodiment, a module-type DC-DC converter is taken as an example of the electronic component 100, but an example of the electronic component 100 is not limited to this. Hereinafter, the structure of the electronic component 100 will be described.

The electronic component 100 is composed roughly of a resin case 102 and a circuit board module 104, for instance. The inside of the resin case 102 is sealed with a filler (for example, urethane resin) in a state where the circuit board module 104 is housed in the resin case 102, and as a result, the electronic component 100 is completed. The resin case 102 has a hollow cover shape, and its lower surface has the same shape as the outer shape of the circuit board module 104 and is open.

A magnetic core 106 is combined with the circuit board module 104. In the circuit board module 104, a primary circuit 120 and two systems of secondary circuits 122, 124 of the DC-DC converter are mainly formed, and when the DC-DC converter operates, the primary circuit 120 is magnetically coupled with the secondary circuits 122, 124 by the magnetic core 106. Note that the primary circuit 120 and the secondary circuits 122, 124 have various electronic components mounted on their upper surfaces in terms of the direction in FIG. 1 of the circuit board module 104, but the illustration of these electronic components is omitted.

Figure 2:
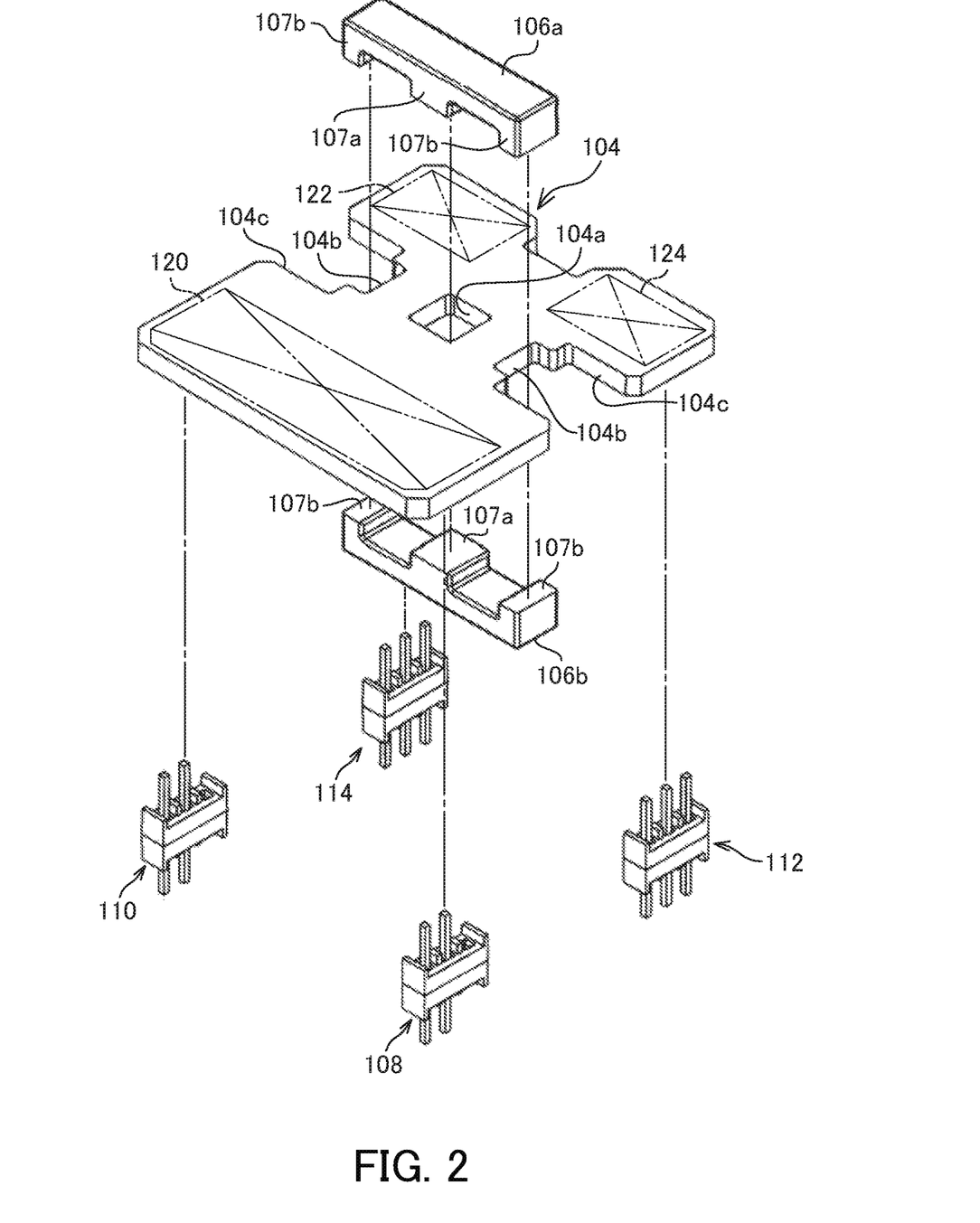
FIG. 2 is an exploded perspective view illustrating only a circuit board module.

FIG. 2 illustrates only the circuit board module 104 in a disassembled state. In the circuit board module 104, not only the magnetic core 106 is combined as described above but also a plurality of input terminal arrays 108, 110 and output terminal arrays 112, 114 are mounted.

The magnetic core 106 has, for example, an E-E structure, in which two core parts 106a, 106b are combined from both surface sides of the circuit board module 104 so as to face each other. In this embodiment, there is no gap between the two core parts 106a, 106b of the magnetic core 106, but there may be a gap therebetween. For the assembly of the magnetic core 106, the circuit board module 104 has an insertion hole 104a formed at a position close to the center, and in addition, has a pair of cutout portions 104b formed in both side edge portions with the insertion hole 104a therebetween.

The insertion hole 104a is opened in a substantially square shape in both the surfaces of the circuit board module 104 and penetrates through the circuit board module 104 in the thickness direction, and in the insertion hole 104a, middle legs 107a of the magnetic core 106 are inserted from both sides.

The pair of cutout portions 104b are formed in a U-shape from both the edge portions toward an inner side of the circuit board module 104, and both outer legs 107b of the magnetic core 106 are fitted to the pair of cutout portions 104b. Note that, in this embodiment, the pair of cutout portions 104b form holding spaces 104c. Specifically, side portions of the pair of cutout portions 104b widen in the width direction by one step, which makes the holding spaces 104c to function as follows. That is, the holding spaces 104c function as spaces for an assembly work of the magnetic core 106. The assembly work includes, for example, in the state where the magnetic core 106 is assembled to the circuit board module 104 as illustrated in FIG. 1, applying an adhesive on abutting surfaces in both sides of the two core parts 106a, 106b, sticking an adhesive tape, or clipping the core parts 106a, 106b together. The holding spaces 104c improve assembly workability of the electronic component 100 to enhance production efficiency, thereby capable of contributing to a manufacturing cost reduction. Note that the cutout portions 104b and the widened portions 104c will be described later.

The input terminal arrays 108, 110 are mounted on the circuit board module 104 through not illustrated through holes to be connected to the primary circuit 120. The output terminal arrays 112, 114 are also mounted on the circuit board module 104 through not illustrated through holes to be connected to the secondary circuits 122, 124. In the completed electronic component 100, these input terminal arrays 108, 110 and output terminal arrays 112, 114 project downward from the resin case 102.

Figure 3:
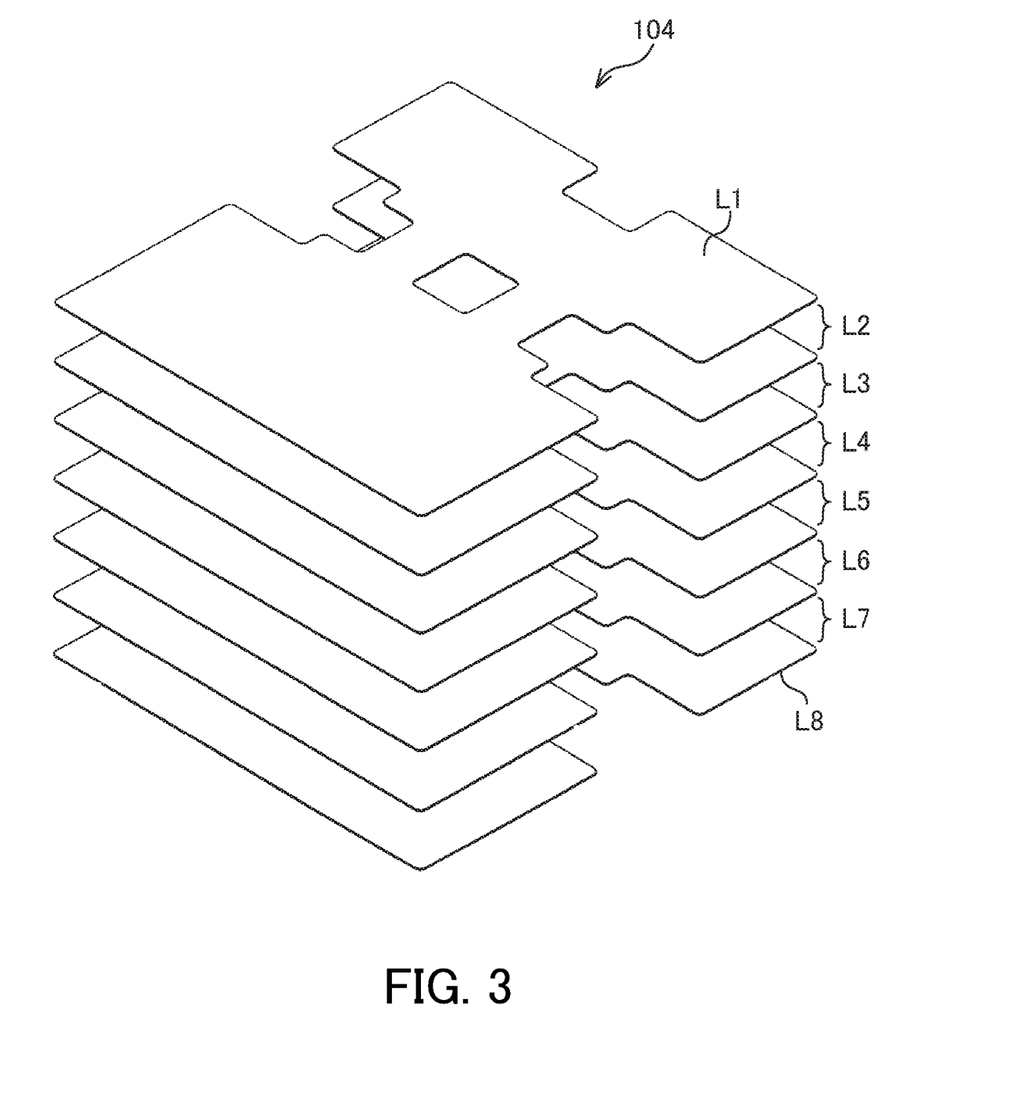
FIG. 3 is an exploded perspective view schematically illustrating a multilayer structure of the circuit board module.

FIG. 3 schematically illustrates a multilayer structure of the circuit is board module 104 and illustrates its state of being disassembled into many boards for stacking. In the completed circuit board module 104, all the boards for stacking are integrated because they have undergone firing, and in this structure, the post-disassembly is not possible, but here the disassembled state is illustrated for convenience of the understanding of the multilayer structure.

The circuit board module 104 has the multilayer structure composed of a stack of, for example, seven sheets of the boards for stacking (called sheet boards, green sheets, or the like) which have been integrally fired. Hereinafter, for convenience' sake, an upper surface of the uppermost layer in the stacking direction will be referred to as a first layer L1, a space between its lower surface and an upper surface of a board for stacking at the second highest position as a second layer L2, a space between its lower surface and an upper surface of a board for stacking at the third highest position as a third layer L3, a space between its lower surface and an upper surface of a board for stacking at the fourth highest position as a fourth layer L4, a space between its lower surface and an upper surface of a board for stacking at the fifth highest position as a fifth layer L5, a space between its lower surface and an upper surface of a board for stacking at the sixth highest position as a sixth layer L6, a space between its lower surface and an upper surface of a board for stacking at the seventh highest position as a seventh layer L7, and a lower surface of the lowest board for stacking as an eighth layer L8.

First, the layer structure will be described with reference to sections of the circuit board module 104.

Figure 4:
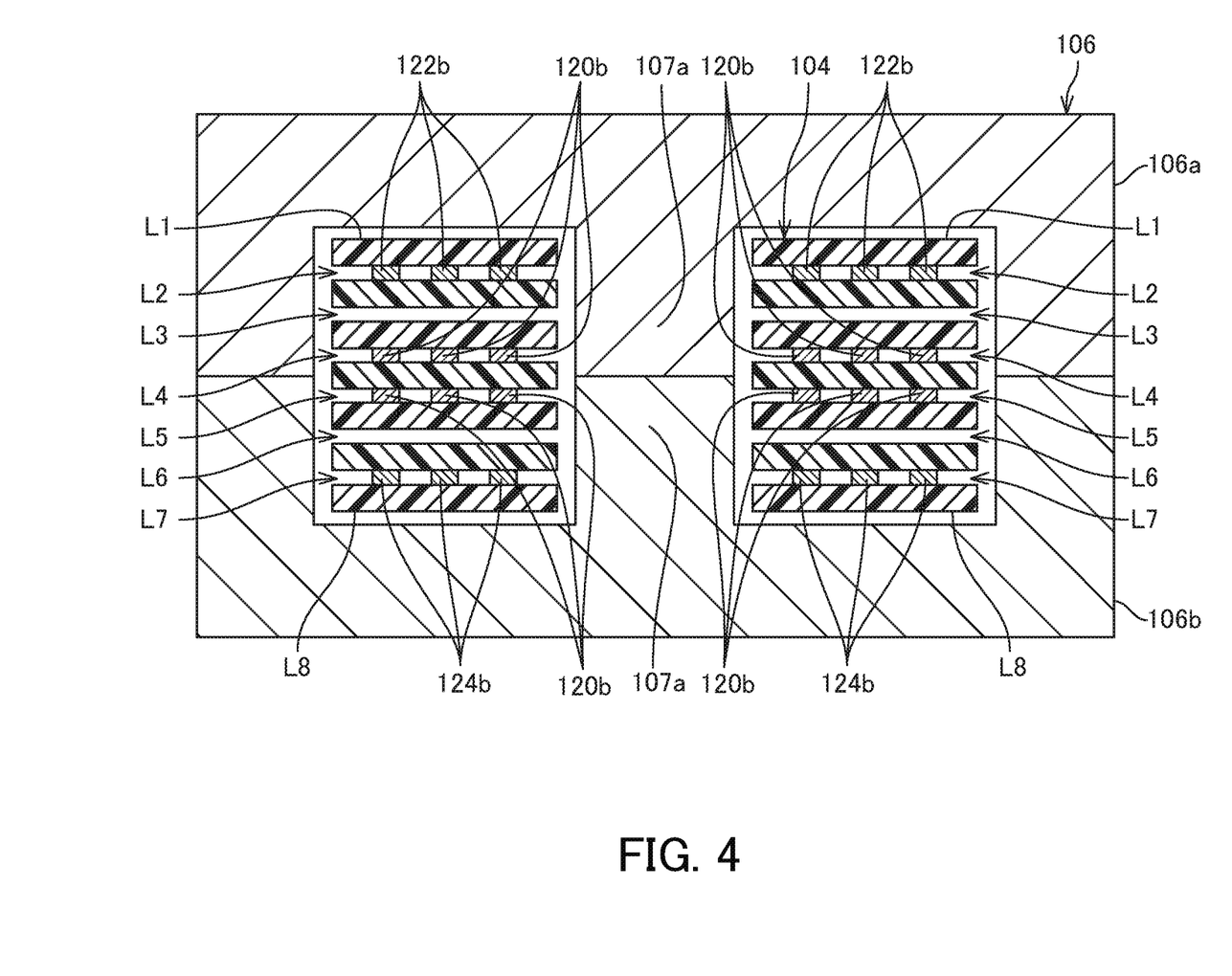
FIG. 4 is a vertical sectional view taken along the IV-IV line in FIG. 1.
Figure 5:
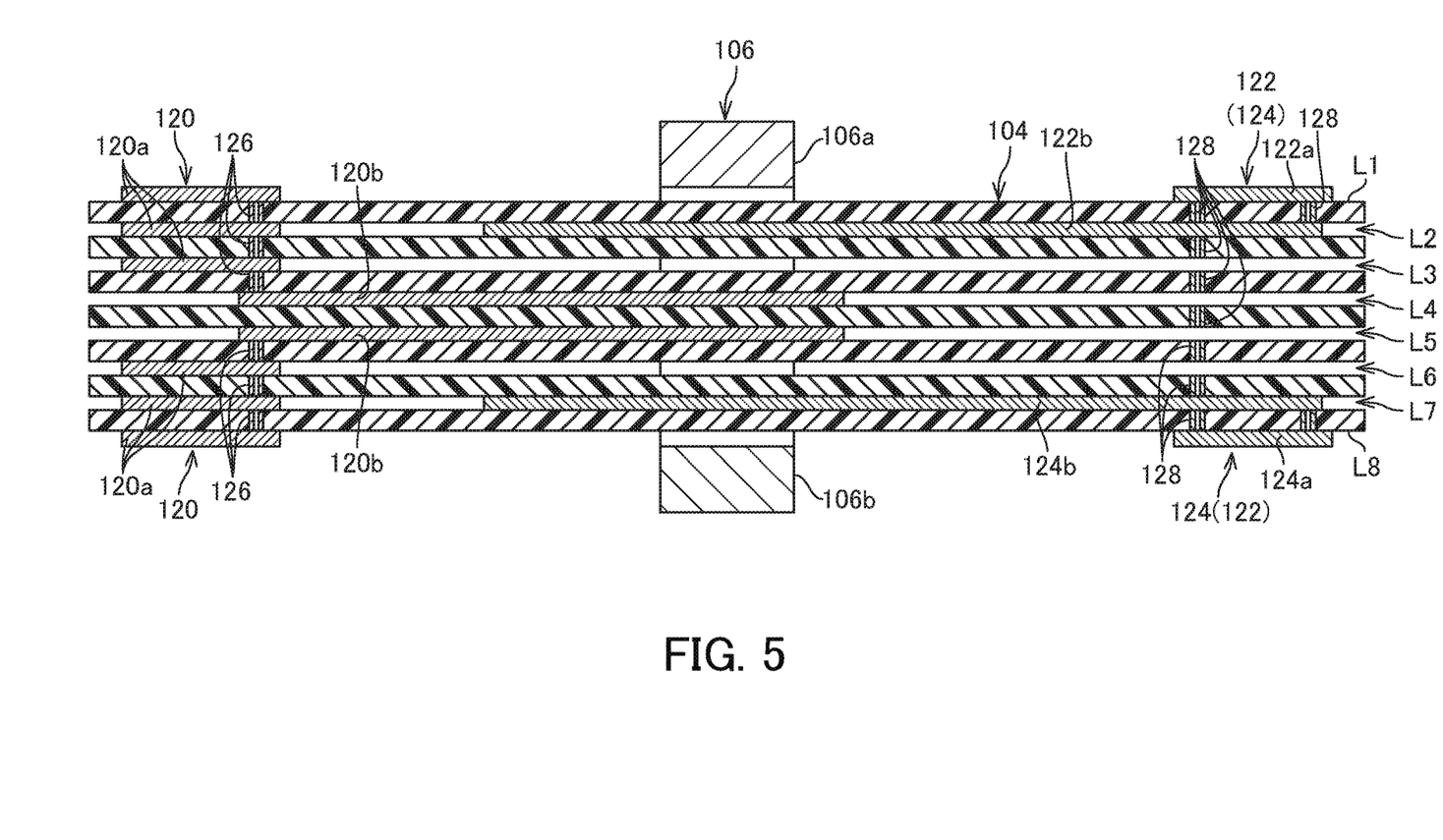
FIG. 5 is a vertical sectional view taken along the V-V line in FIG. 1.

FIG. 4 illustrates a vertical section of the circuit board module 104 and the magnetic core 106 along the longitudinal direction of the magnetic core 106 (IV-IV section in FIG. 1). Further, FIG. 5 illustrates a vertical section of the circuit board module 104 and the magnetic core 106 along the width direction of the magnetic core 106 (V-V section in FIG. 1). Note that, in FIG. 4 and FIG. 5, the layers of the boards for stacking and wiring patterns are each illustrated with an exaggerated thickness. Hereinafter, the arrangement of the wiring patterns in the layers will be described.

[First Layer (Uppermost Layer)]
The first layer L1 is located on the upper surface of the circuit board module 104. In the first layer L1, a primary pattern 120a constituting a wiring pattern of the primary circuit 120 is mainly formed, and a secondary pattern 122a constituting a wiring pattern of the secondary circuit 122 is also formed. These primary pattern 120a and secondary pattern 122a are each arranged at a position apart from regions immediately under and near the magnetic core 106 by a predetermined insulation distance.

[Second Layer (Second Highest Layer)]
The second layer L2 is located in a layer inside the circuit board module 104. In the second layer L2, a primary pattern 120a and in addition, a secondary winding 122b constituting a wiring pattern of the secondary circuit 122 is formed. The primary pattern 120a is arranged apart from the magnetic core 106, but the secondary winding 122b is arranged so as to depict a spiral shape around the magnetic core 106 (middle legs 107a).

[Third Layer (Third Highest Layer)]
The third layer L3 is located in a layer inside the circuit board module 104. In the third layer L3, only a primary pattern 120a is arranged.

[Fourth Layer (Fourth Highest Layer)]
The fourth layer L4 is located in a layer inside the circuit board module 104. In the fourth layer L4, only a primary winding 120b is formed. The primary winding 120b is arranged so as to depict a spiral shape around the magnetic core 106 (middle legs 107a).

[Fifth Layer (Fifth Highest Layer)]
The fifth layer L5 is located in a layer inside the circuit board module 104. In the fifth layer L5, only a primary winding 120b is formed. As in the aforesaid fourth layer L4, the primary winding 120b is arranged so as to depict a spiral shape around the magnetic core 106.

[Sixth Layer (Sixth Highest Layer)]
The sixth layer L6 is located in a layer inside the circuit board module 104. In the sixth layer L6, only a primary pattern 120a is arranged.

[Seventh Layer (Seventh Highest Layer)]
The seventh layer L7 is located in a layer inside the circuit board module 104. In the seventh layer L7, a primary pattern 120a and in addition a secondary winding 124b constituting a wiring pattern of the secondary circuit 124 which is a different system from that in the first and second layers are formed. As in the aforesaid second layer, the primary pattern 120a is arranged apart from the magnetic core 106, but the secondary winding 124b is arranged so as to depict a spiral shape around the magnetic core 106 (middle legs 107a).

[Eighth Layer (Eighth Highest Layer)]
The eighth layer L8 is located on the lower surface of the circuit board module 104. In the eighth layer L8, a primary pattern 120a constituting a wiring pattern of the primary circuit 120 is mainly formed, and in addition a secondary pattern 124a constituting a wiring pattern of the secondary circuit 124 which is a different system from that in the first and second layers are formed. These primary pattern 120a and secondary pattern 124a are each arranged at a position apart from regions immediately under and near the magnetic core 106 by a predetermined insulation distance when seen from the lower direction of the magnetic core 106.

As illustrated in FIG. 5, in the circuit board module 104, primary via holes 126 and secondary via holes 128 are also formed. The primary via holes 126 each connect the wiring patterns in a plurality of layers of the primary circuit 120, for example, connect the primary pattern 120a and the primary winding 120b. The secondary via holes 128 each connect the wiring patterns of the plurality of layers of the secondary circuits 122, 124, for example, connect the secondary pattern 122*a* and the secondary winding 122*b*, and the secondary pattern 124*a* and the secondary winding 122*b*. Note that the illustrated width-direction positions of the primary via holes 126 and the secondary via holes 128 are only for convenience' sake.

Next, the planar structures of the layers will be described.

FIG. 6A to FIG. 6D are plan views of the layers from the first layer L1 to the fourth layer L4. FIG. 7A to FIG. 7D are plan views of the layers from the fifth layer L5 to the eighth layer L8. Note that, as the plan view of the eighth layer L8, a plane seen from the bottom (lower surface) of the circuit board module 104 is illustrated. In FIG. 6A to FIG. 6D and FIG. 7A to FIG. 7D, detailed illustrations of the shapes of the wiring patterns, the arrangements of other via holes and through holes, and so on are omitted.

[First Layer (Uppermost Layer)]

Figure 6A:
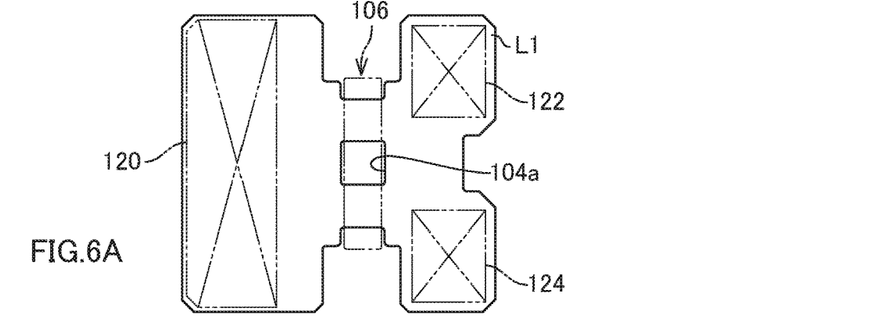
FIG. 6A to FIG. 6D are plan views of layers from a first layer to a fourth layer.

FIG. 6A: In the first layer L1, the primary circuit 120 and the two systems of secondary circuits 122, 124 (including the wiring patterns and mounted components) are formed as described above, but none of the primary winding 120*b* and the secondary windings 122*b*, 124*b* is arranged. Further, insulation distances of the primary circuit 120 and the secondary circuits 122, 124 from the magnetic core 106 are large enough to improve withstand (withstand voltage) performance. In this embodiment, none of the primary winding 120*b* and the secondary windings 122*b*, 124*b* is formed in the first layer L1 and thus they are not exposed to the periphery of the magnetic core 106, which also greatly contributes to an improvement in withstand performance.

[Second Layer (Second Highest Layer)]

Figure 6B:
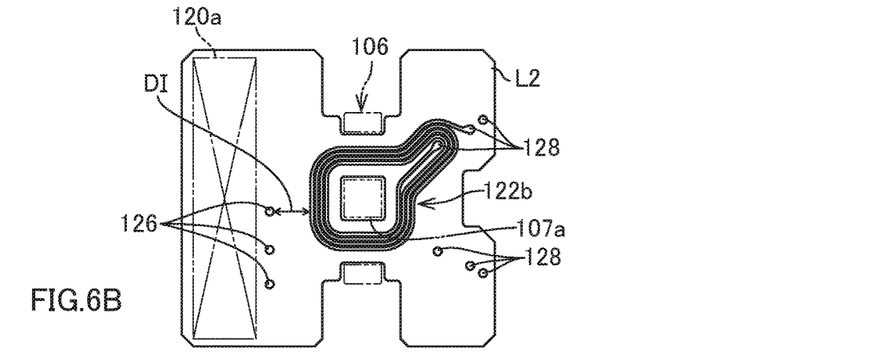

FIG. 6B: In the second layer L2, the wiring pattern of the secondary winding 122*b* is formed as described above. Here, when focusing on the pattern shape of the secondary winding 122*b*, it is seen that the positions of its outer peripheral end and inner peripheral end (not denoted by reference signs) are both apart from the middle legs 107*a* of the magnetic core 106 in an outward direction. Besides, in the second layer L2, the primary pattern 120*a* is formed.

[Third Layer (Third Highest Layer)]

Figure 6C:
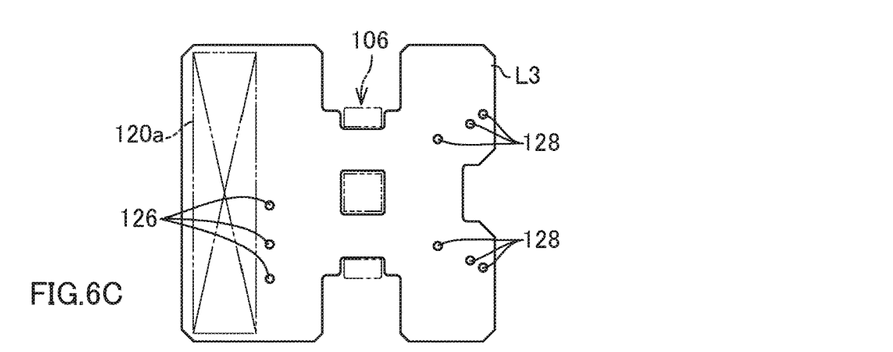

FIG. 6C: In the third layer L3, only the primary pattern 120*a* is mainly formed as described above. Thus, this embodiment does not have a structure in which the primary winding 120*b* is formed so as to be adjacent to the secondary winding 122*b* of the second layer L2.

[Fourth Layer (Fourth Highest Layer)]

Figure 6D:
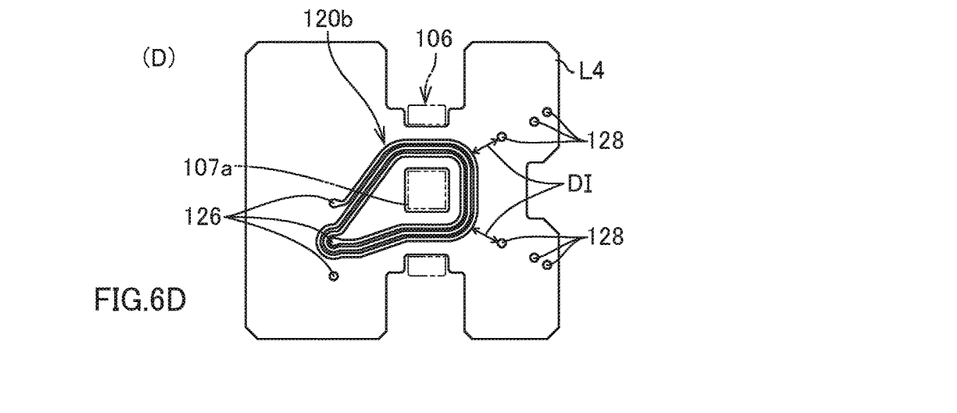

FIG. 6D: In the fourth layer L4, the wiring pattern of the primary winding 120*b* is formed apart from the second layer L2 with the third layer L3 therebetween. Here as well, when focusing on the pattern shape of the primary winding 120*b*, it is seen that the positions of its outer peripheral end and inner peripheral end (not denoted by reference signs) are both apart from the middle legs 107*a* of the magnetic core 106 in a direction which is the outward direction and the direction opposite to the direction in which those of the secondary winding 122*b* are apart.

As is apparent from the planar structures of the layers described so far, the insulation distance is provided in this embodiment as follows.

(1) FIG. 6C: The third layer L3 is interposed as an insulating layer between the second layer L2 and the fourth layer L4, and in the third layer L3, in its regions overlapping with the secondary winding 122*b* and the primary winding 120*b* in the layer direction, neither of these wiring patters is formed. Consequently, the insulation distance corresponding to two layers (larger than one layer) is provided between the primary winding 120*b* and the secondary winding 122*b*.

(2) FIG. 6B and FIG. 6D: The primary winding 120*b* and the secondary winding 122*b* are both arranged such that not only their outer peripheral ends but also their inner peripheral ends are apart in the outward direction from the middle legs 107*a* of the magnetic core 106. Specifically, the secondary winding 122*b* of the second layer L2 is arranged such that neither of its inner peripheral end and outer peripheral end overlaps with the primary winding 120*b* of the fourth layer L4 in the layer direction, and the primary winding 120*b* of the fourth layer L4 is arranged such that neither of its inner peripheral end and outer peripheral end overlaps with the secondary winding 122*b* of the second layer L2 in the layer direction. Accordingly, in the second layer L2, the positions of the primary via holes 126 are outside a winding region of the secondary winding 122*b*, and a predetermined insulation distance DI is provided therebetween. Further, in the fourth layer L4, the positions of the secondary via holes 128 are outside a winding region of the primary winding 120*b*, and a predetermined insulation distance DI is also provided therebetween. Note that the insulation distances DI in the second layer L2 and the fourth layer L4 may be different.

Typically, the wiring patterns of the primary winding 120*b* and the secondary winding 122*b* basically depict the spiral shape around the middle legs 107*a*, and the purpose of this arrangement is to converge a magnetic flux in the magnetic core 106. Accordingly, the inner peripheral ends are thought to be naturally arranged near the middle legs 107*a*. However, in this embodiment, the inner peripheral ends are also disposed intentionally at positions apart from the middle legs 107*a* in the outward direction. This ensures that the insulation distance DI between the primary winding 120*b* and the secondary via holes 128 of the other side is large, and the insulation distance DI between the secondary winding 122*b* and the primary via holes 126 of the other side is large as described above.

(3) FIG. 6A: In addition, the non-exposure of the secondary winding 122*b* to the outer surface of the circuit board module 104 also ensures that the insulation distance is provided from the magnetic core 106.

Next, the insulation from the secondary circuit 124 which is a different system will be described with reference to FIG. 7A to FIG. 7D.

[Fifth Layer (Fifth Highest Layer)]

Figure 7A:
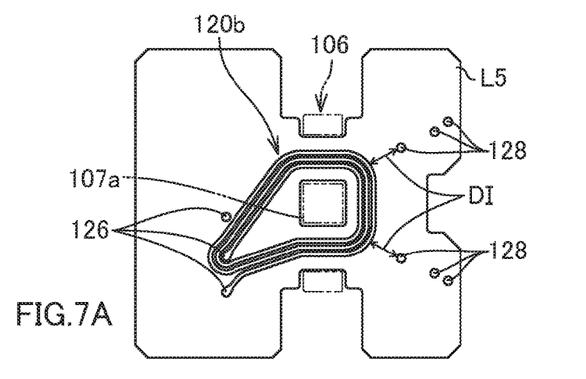
FIG. 7A to FIG. 7D are plan views of layers from a fifth layer to an eighth layer.

FIG. 7A: In the fifth layer L5, the wiring pattern of the primary winding 120*b* is formed. Here as well, when focusing on the pattern shape of the primary winding 120*b*, it is seen that the positions of its outer peripheral end and inner peripheral end (not denoted by reference signs) are both apart from the middle legs 107*a* of the magnetic core 106 in a direction which is the outward direction and the direction opposite to the direction in which those of the secondary windings 122*b*, 124*b* are apart.

[Sixth Layer (Sixth Highest Layer)]

Figure 7B:
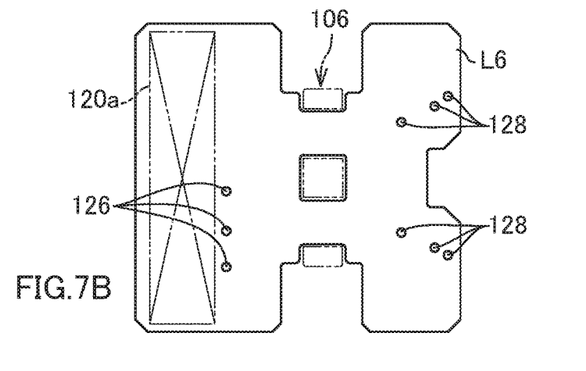

FIG. 7B: In the sixth layer L6, only the primary pattern 120*a* is mainly formed. Therefore, this embodiment does not have a structure in which the secondary winding 124*b* is formed so as to be adjacent to the primary winding 120*b* of the fifth layer L5.

[Seventh Layer (Seventh Highest Layer)]

Figure 7C:
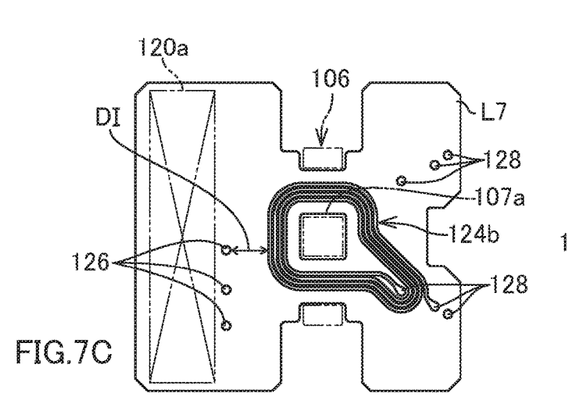

FIG. 7C: As described above, in the seventh layer L7, the wiring pattern of the secondary winding 124*b* is formed apart from the fifth layer L5 with the sixth layer L6 therebetween. Here as well, when focusing on the pattern shape of the secondary winding 124*b*, it is seen that the positions of its outer peripheral end and inner peripheral end (not denoted by reference signs) are both apart from the middle legs 107a of the magnetic core 106 in the outward direction. Note that, in the seventh layer L7, besides the secondary winding 124b, the primary pattern 120a is formed.

[Eighth Layer (Eighth Highest Layer)]

Figure 7D:
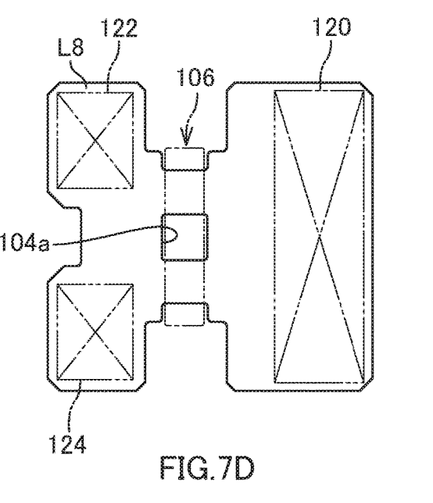

FIG. 7D: In the eighth layer L8, the primary circuit 120 and the two systems of secondary circuits 122, 124 (including the wiring patterns and mounted components) are formed as described above, but none of the primary winding 120b and the secondary windings 122b, 124b is formed. Further, insulation distances of the primary circuit 120 and the secondary circuits 122, 124 from the magnetic core 106 are large enough to improve withstand performance. In this embodiment, the eighth layer L8 has no primary winding 120b and secondary windings 122b, 124b either, and therefore they are not exposed to the periphery of the magnetic core 106, which also contributes greatly to an improvement in withstand performance.

As is apparent from the planar structures of the other layers, the insulation distance is further provided as follows in this embodiment.

(4) FIG. 7B: The sixth layer L6 is interposed as an insulating layer between the fifth layer L5 and the seventh layer L7, and in the sixth layer L6, in its regions overlapping with the primary winding 120b and the secondary winding 124b in the layer direction, neither of these wiring patterns is formed. Consequently, the insulation distance corresponding to two layers (larger than one layer) is provided between the primary winding 120b and the secondary winding 124b.

(5) FIG. 7A and FIG. 7C: The primary winding 120b and the secondary winding 124b are both arranged such that not only their outer peripheral ends but also their inner peripheral ends are apart in the outward direction from the middle legs 107a of the magnetic core 106. Specifically, the secondary winding 124b of the seventh layer L7 is arranged such that neither of its inner peripheral end and outer peripheral end overlaps with the primary winding 120b of the fifth layer L5 in the layer direction, and the primary winding 120b of the fifth layer L5 is arranged such that neither of its inner peripheral end and outer peripheral end overlaps with the secondary winding 122b of the seventh layer L7 in the layer direction. Accordingly, in the fifth layer L5, the positions of the secondary via holes 128 are outside the winding region of the primary winding 120b, and a predetermined insulation distance DI is provided therebetween. Further, in the seventh layer L7, the positions of the primary via holes 126 are outside the winding region of the secondary winding 124b, and a predetermined insulation distance DI is also provided therebetween. Note that the insulation distances DI in the fifth layer L5 and the seventh layer L7 may be different.

(6) FIG. 7D: In addition, the non-exposure of the secondary winding 124b to the outer surface (lower surface) of the circuit board module 104 also ensures that the insulation distance is provided from the magnetic core 106.

Figure 8:
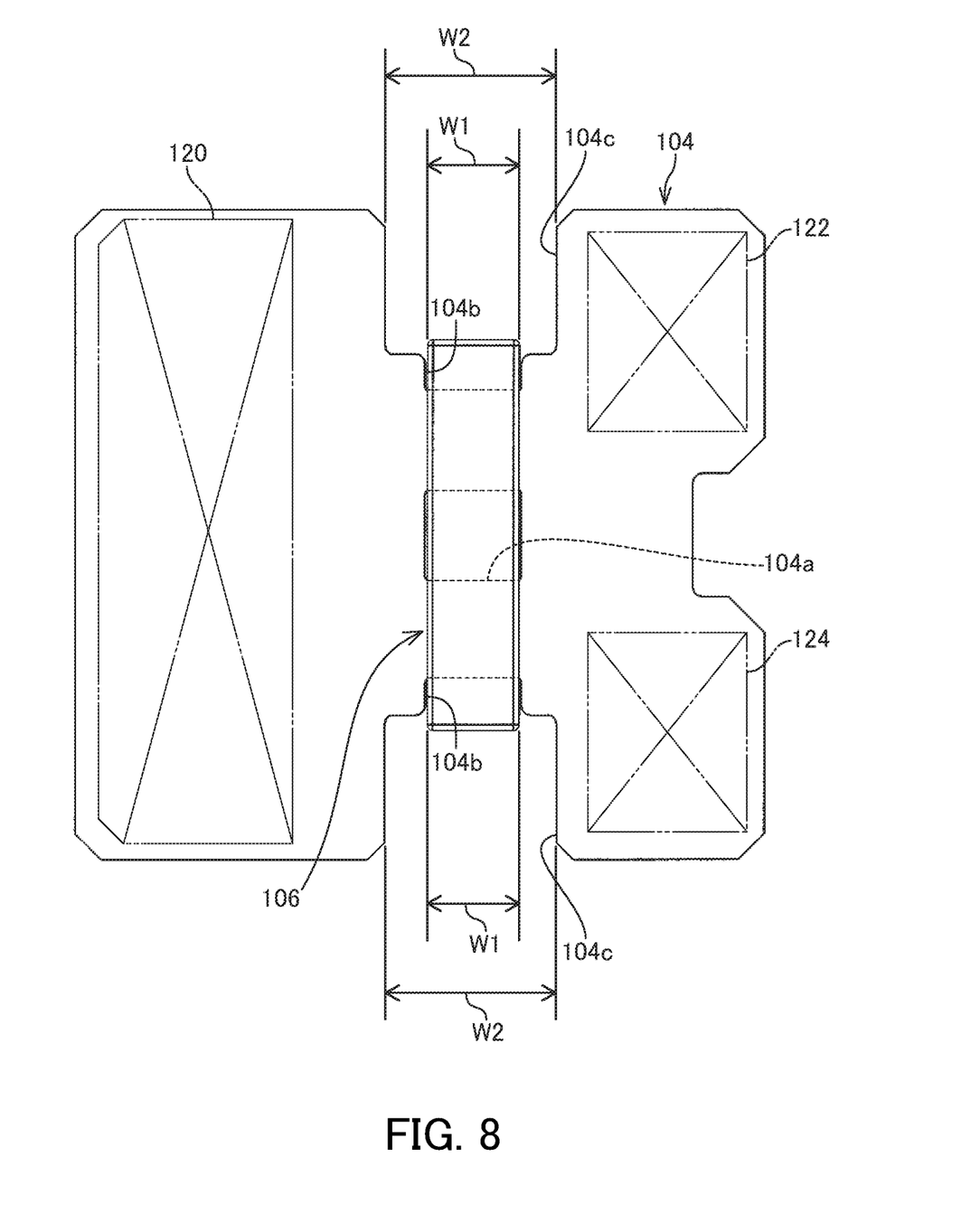
FIG. 8 is a plan view of the circuit board module.

FIG. 8 is a plan view of the circuit board module 104. As described above, in the circuit board module 104, the pair of cutout portions 104b are formed in both the side edge portions with the insertion hole 104a therebetween, and the magnetic core 106 has the middle legs 107a inserted to the insertion hole 104a and has the pair of outer legs 107b housed in the cutout portions 104b respectively.

The cutout portions 104b have a width W1 for housing in the width direction (direction perpendicular to the longitudinal direction) of the magnetic core 106. This width W1 for housing is set slightly larger than the width of the magnetic core 106, and in a state where the magnetic core 106 is housed in the cutout portions 104b, the displacement of the magnetic core 106 from the proper attachment position is surely prevented. Consequently, the magnetic core 106 is accurately positioned in the cutout portions 104b relative to the circuit board module 104 to be fixed in its positional relation with the aforesaid primary winding 120b and the secondary windings 122b, 124b, so that it is capable of properly magnetically coupling the primary circuit 120 and the secondary circuits 122, 124.

If it is intended only to position the magnetic core 106 relative to the circuit board module 104, it suffices that only the cutout portions 104b are provided, which means that it suffices that portions in the cutout shape provided in both the side edge portions of the circuit board module 104 have the width W1 for housing. Further, giving an allowance more than necessary to the width W1 for housing leads to the displacement of the magnetic core 106.

Under such circumstances, in this embodiment, the widened portions 104c are further formed in the circuit board module 104 while the width W1 for housing of the cutout portions 104b is set to the minimum. The widened portions 104c continue from the cutout portions 104b and are formed in the cutout shape from both the edge portions toward the inner side of the circuit board module 104, but they are widened in the width direction to have a widened width W2 larger than the width of the cutout portions 104b, and accordingly, spaces located on both sides of the magnetic core 106 are larger than the width W1 for housing. As an example, the widened width W2 is suitably about 1.5 times to about 2.5 times the width W1 for housing.

Figure 9:
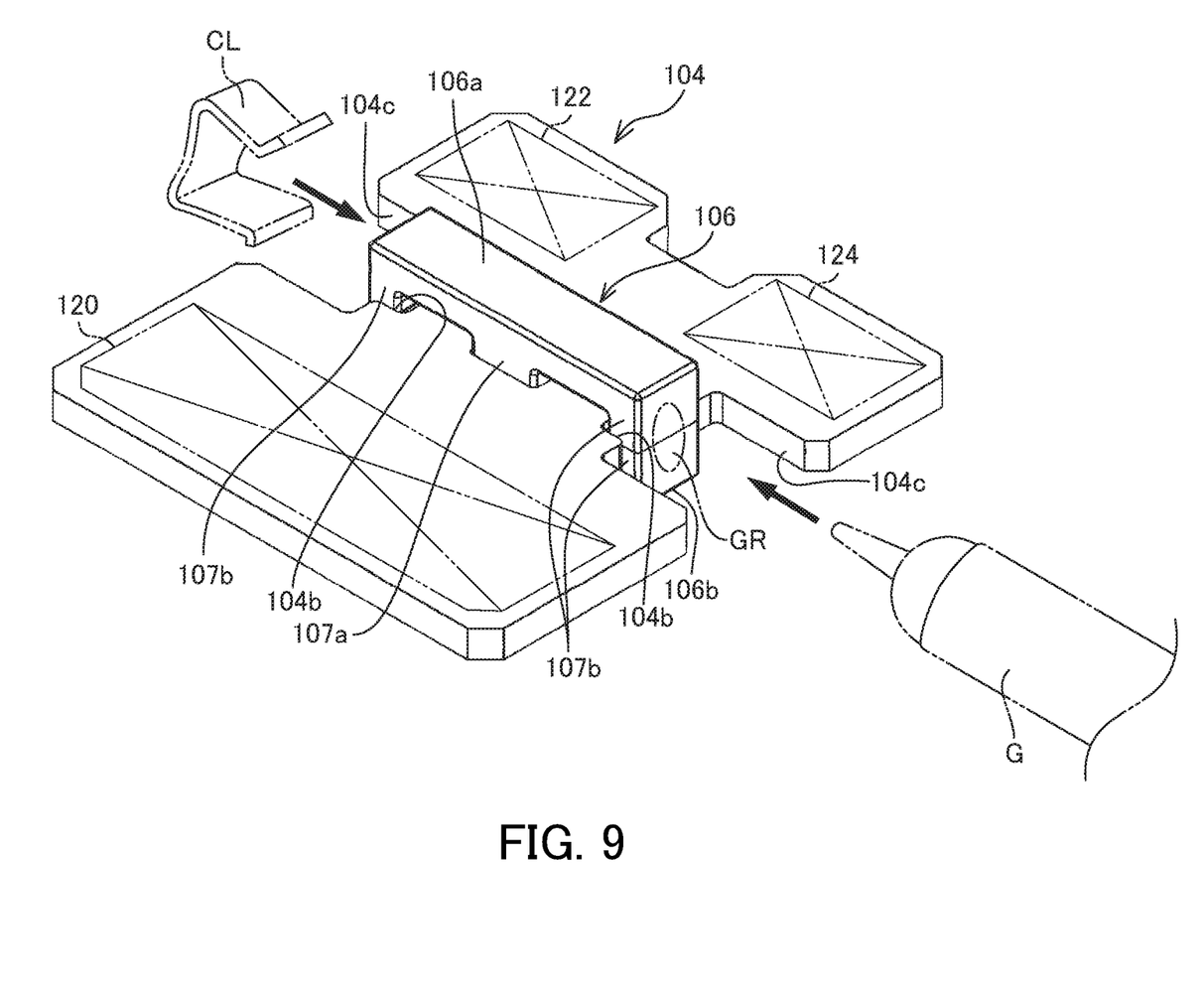
FIG. 9 is a perspective view illustrating assembly workability of a magnetic core to the circuit board module.

FIG. 9 illustrates a state of the assembly work of the magnetic core 106 to the circuit board module 104. Since, as described above, the magnetic core 106 is composed of the two core parts 106a, 106b which are combined in the thickness direction of the circuit board module 104, the two core parts 106a, 106b need to be fixed to each other by a method such as bonding. At this time, owing to the widened portions 104c provided on the sides continuing from the pair of cutout portions 104b as described above, it is possible to greatly improve workability when the core parts 106a, 106b are bonded together or temporarily and finally fixed together.

For example, by bringing a glue gun G or the like close to the two core parts 106a, 106b which are in a state of abutting on each other, from the widened portion 104c, it is possible to suitably apply an adhesive GR on a joint between the core parts 106a, 106b.

Another method to fix the two core parts 106a, 106b together is to temporarily assemble them into the state where they abut on each other and sandwich them with, for example, a metal clip CL or the like through the widened portion 104c. A still another method to fix them together, though not illustrated, is to temporarily assemble them into the state where they abut on each other and stick, for example, an adhesive tape or the like through the widened portion 104c.

In particular, in the case where the position of the joint of the two core parts 106a, 106b is within a range of the thickness (height direction) of the circuit board module 104 as in this embodiment, the position of this joint is also within the widened portions 104c, which greatly improves accessibility and workability from the sides as illustrated in FIG. 9. In this respect, a structure where the widened portions 104c are not provided makes it difficult to access the joint portion from the sides to cause a great trouble in the work of applying the adhesive GR or the work of sandwiching with the metal clip CL, but in this embodiment, since the widened portions 104c are provided, it is possible to greatly enhance the workability and work efficiency.

Besides, by making the most use of the widened width W2 of the widened portions 104c, it is possible to greatly enhance the assembly workability, enabling a production efficiency increase and a cost reduction of the electronic component 100.

According to the electronic component 100 of this embodiment, it is possible to not only accurately position the magnetic core 106 to the circuit board module 104 but also greatly improve the assembly workability.

Further, according to the electronic component 100 of this embodiment, by providing the insulation distance among the primary circuit 120, the secondary circuit 122, and the magnetic core 106, it is possible to improve the withstand performance of the whole circuit. Therefore, in the case where the electronic component 100 is the DC-DC converter, it is usable in a higher-voltage region, which can enhance its general versatility and applicability.

In the embodiment, the widened portions 104c are formed symmetrically with respect to the center line of the magnetic core 106 in terms of the longitudinal direction, but the widened portions 104c may be deviated to either side from the center line and thus may be asymmetric. Further, the widened portions 104c may have a tapered shape such that they get wider as they go closer to both the side edge portions of the circuit board module 104, and may become wider not only linearly but also in a curved manner.

The embodiment has the circuit structure including the two systems of secondary circuits 122, 124, but it may have a circuit structure including only the single system of secondary circuit 122 (or secondary circuit 124) for the primary circuit 120. The layer structure in this case can be a six-layer structure of the layers in FIG. 6A, FIG. 6B, FIG. 6C, FIG. 6D, FIG. 7B, and FIG. 7C in the order from the top.

The patterns of the primary winding 120b and the secondary windings 122b, 124b are not limited to the examples illustrated in FIG. 6A to FIG. 6D and FIG. 7A to FIG. 7D, and may have other pattern shapes. For example, the pattern of the primary winding 120b may have such a pattern shape that its portions except the inner peripheral end and the outer peripheral end are closer to the middle legs 107a of the magnetic core 106. Further, the positions of the inner peripheral ends and the outer peripheral ends of the primary winding 120b and the secondary windings 122b, 124b may be more apart from the middle legs 107a than in the examples illustrated in FIG. 6B, FIG. 6D, FIG. 7A, and FIG. 7C.

The magnetic core 106 may be of another type such as an E-I type, a U-U type and a U-I type besides the E-E type. Further, the two core parts 106a, 106b may be bonded together with an adhesive, may be bonded together with an adhesive tape, or may be fixed with a member such as a clip sandwiching these.

The outer shape of the circuit board module 104 is not limited to the illustrated example, and may be a circular shape or any other polygonal shape.

In the embodiment, the electronic component 100 is the DC-DC converter, but may be implemented as a planar transformer or a reactor.

Besides, the structure described with reference to the drawings in the embodiment is only a preferred example. Various kinds of elements may be added to the basic structure of the embodiment, or some of the elements may be replaced.

What is claimed is:

1. An electronic component comprising:
   a circuit board in which a primary circuit and a secondary circuit are each formed using a plurality of layers of wiring patterns;
   a magnetic core attached to the circuit board to magnetically couple the primary circuit and the secondary circuit;
   a cutout portion which is formed in a cutout shape from a side edge portion toward an inner side of the circuit board and which fixes the magnetic core at a predetermined attachment position in a state of housing the magnetic core; and
   a widened portion which continues from the cutout portion and is formed in a cutout shape from the side edge portion toward the inner side of the circuit board, and which has a width larger than a width that the cutout portion has for housing the magnetic core, the widened portion being wider than the cutout portion in a direction perpendicular to a longitudinal direction of the magnetic core.

2. The electronic component according to claim 1, wherein the magnetic core comprises two parts into which the magnetic core is divided and which oppose each other along a thickness direction of the circuit board, a joint between the two parts being positioned in the widened portion.

\* \* \* \* \*

UNITED STATES PATENT AND TRADEMARK OFFICE
CERTIFICATE OF CORRECTION

PATENT NO. : 10,580,569 B2  
APPLICATION NO. : 16/413936  
DATED : March 3, 2020  
INVENTOR(S) : Hiroo Ogawa and Tomohiko Yoshino Page 1 of 1

It is certified that error appears in the above-identified patent and that said Letters Patent is hereby corrected as shown below:

On the Title Page

Item (57) under "ABSTRACT", Line 4, delete "wring" and insert --wiring--.

In the Specification

Column 3, Line 28, delete "is".

Signed and Sealed this  
Twenty-fifth Day of August, 2020

Andrei Iancu  
*Director of the United States Patent and Trademark Office*